(12) United States Patent
Kim

(10) Patent No.: US 11,916,042 B2
(45) Date of Patent: Feb. 27, 2024

(54) SEMICONDUCTOR PACKAGE HAVING CHIP STACK

(71) Applicant: SAMSUNG ELECTRONICS CO., LTD., Suwon-si (KR)

(72) Inventor: Won-Young Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 556 days.

(21) Appl. No.: 17/169,701

(22) Filed: Feb. 8, 2021

(65) Prior Publication Data

US 2021/0183818 A1 Jun. 17, 2021

Related U.S. Application Data

(63) Continuation of application No. 16/214,397, filed on Dec. 10, 2018, now Pat. No. 10,930,618.

(30) Foreign Application Priority Data

Feb. 1, 2018 (KR) .......................... 10-2018-0012948

(51) Int. Cl.
*H01L 29/40* (2006.01)
*H01L 23/48* (2006.01)
(Continued)

(52) U.S. Cl.
CPC .......... *H01L 25/0657* (2013.01); *H01L 24/32* (2013.01); *H01L 24/48* (2013.01);
(Continued)

(58) Field of Classification Search
CPC ..... H01L 25/0657; H01L 24/32; H01L 24/48; H01L 24/73; H01L 2224/32145; H01L 2224/32225; H01L 2224/48145; H01L 2224/48227; H01L 2224/73265; H01L 2225/06506; H01L 2225/0651; H01L 2225/06562; H01L 2924/00014; H01L 23/3192; H01L 24/49; H01L 23/3121; H01L 23/3135; H01L 2224/04042; H01L 2224/49109; H01L 2924/15192; H01L 2924/15311; H01L 25/18;
(Continued)

(56) References Cited

U.S. PATENT DOCUMENTS 7,312,519 B2 * 12/2007 Song ....................... H01L 25/16
257/782
8,290,319 B2 10/2012 Harada et al.
(Continued)

FOREIGN PATENT DOCUMENTS

CN 102386161 A 3/2012
KR 10-1128063 B1 4/2012
(Continued)

*Primary Examiner* — Theresa T Doan
(74) *Attorney, Agent, or Firm* — Muir Patent Law, PLLC

(57) ABSTRACT

A semiconductor package includes a substrate, a master chip on the substrate, a first slave chip on a top surface of the master chip and partially exposing the top surface of the master chip, the first slave chip having a same size as the master chip and having a same storage capacity as the master chip, and a first chip connector on the exposed top surface of the master chip and coupled to the master chip and the first slave chip.

20 Claims, 13 Drawing Sheets

(51) Int. Cl.
  *H01L 23/52* (2006.01)
  *H01L 25/065* (2023.01)
  *H01L 23/00* (2006.01)
(52) U.S. Cl.
  CPC .... *H01L 24/73* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2924/00014* (2013.01)
(58) Field of Classification Search
  CPC . H01L 2224/32057; H01L 2224/32147; H01L 2224/49052; H01L 2224/49097; H01L 2224/49107; H01L 25/074; H01L 23/49811; H01L 24/46
  USPC .......................................................... 257/777
  See application file for complete search history.

(56) References Cited

U.S. PATENT DOCUMENTS

| | | | |
|---|---|---|---|
| 8,343,804 B2 | 1/2013 | Coteus et al. | |
| 8,362,624 B2 | 1/2013 | Kang et al. | |
| 8,823,171 B2 | 9/2014 | Cho | |
| 8,884,446 B2 | 11/2014 | Kim et al. | |
| 8,890,330 B2 | 11/2014 | Kim et al. | |
| 9,129,846 B2 | 9/2015 | Song et al. | |
| 9,184,147 B2 | 11/2015 | Bae et al. | |
| 9,245,827 B2 | 1/2016 | Kang et al. | |
| 9,275,755 B2 | 3/2016 | Kim | |
| 9,519,302 B2 | 12/2016 | Kim et al. | |
| 9,633,973 B2 | 4/2017 | Kim et al. | |
| 10,062,661 B2 | 8/2018 | Sato et al. | |
| 2010/0084758 A1 | 4/2010 | Mun | |
| 2010/0244227 A1 | 9/2010 | Kim et al. | |
| 2010/0276189 A1* | 11/2010 | Song | H01L 23/13 174/262 |
| 2012/0013026 A1 | 1/2012 | Han | |
| 2012/0056178 A1 | 3/2012 | Han et al. | |
| 2012/0068360 A1 | 3/2012 | Best | |
| 2013/0087929 A1 | 4/2013 | Kim et al. | |
| 2013/0256917 A1 | 10/2013 | Kim et al. | |
| 2014/0104935 A1 | 4/2014 | Ware et al. | |
| 2014/0252656 A1 | 9/2014 | Lee | |
| 2015/0091118 A1 | 4/2015 | Sato et al. | |
| 2016/0043026 A1 | 2/2016 | Yang et al. | |
| 2017/0033087 A1 | 2/2017 | Chen | |
| 2017/0062321 A1 | 3/2017 | Choi et al. | |
| 2017/0062363 A1 | 3/2017 | Choi et al. | |
| 2017/0243855 A1 | 8/2017 | Kim | |
| 2018/0158809 A1 | 6/2018 | Kim et al. | |

FOREIGN PATENT DOCUMENTS

| | | |
|---|---|---|
| KR | 20150043130 A | 4/2015 |
| KR | 10-2017-0099046 A | 8/2017 |

* cited by examiner

SEMICONDUCTOR PACKAGE HAVING CHIP STACK

CROSS-REFERENCE TO RELATED APPLICATIONS

This is a continuation application based on pending application Ser. No. 16/214,397, filed Dec. 10, 2018, the entire contents of which is hereby incorporated by reference.

Korean Patent Application No. 10-2018-0012948 filed on Feb. 1, 2018, in the Korean Intellectual Property Office, and entitled: "Semiconductor Package," is incorporated by reference herein in its entirety.

BACKGROUND

1. Field

Embodiments relate to a semiconductor package.

2. Description of the Related Art

A semiconductor package may be provided to implement a semiconductor chip for use in electronic products. In a semiconductor package, a semiconductor chip may be mounted on a printed circuit board (PCB), and bonding wires or bumps may be used to electrically connect the semiconductor chip to the printed circuit board.

SUMMARY

Embodiments are directed to a semiconductor package, including a substrate, a first semiconductor chip on the substrate, a first second semiconductor chip on a top surface of the first semiconductor chip and partially exposing the top surface of the first semiconductor chip, the first second semiconductor chip having a same size as the first semiconductor chip and having a same storage capacity as the first semiconductor chip, and a first chip connector on the exposed top surface of the first semiconductor chip and coupled to the first semiconductor chip and the first second semiconductor chip.

Embodiments are also directed to a semiconductor package, including a substrate, a first semiconductor chip on the substrate, the first semiconductor chip having a first region and a second region in a plan view, and a first second semiconductor chip on a top surface of the second region of the first semiconductor chip, the first second semiconductor chip exposing the first region. The first semiconductor chip may include a first pad on a top surface of the first region and electrically connected to the substrate, and a second pad on the top surface of the first region and electrically connected to the first semiconductor chip. The first second semiconductor chip may have a same size as the first semiconductor chip and may have a same shape as the first semiconductor chip Embodiments are also directed to a semiconductor package, including a substrate, a first semiconductor chip on the substrate, the first semiconductor chip having a first region and a second region in a plan view, a second semiconductor chip on a top surface of the second region of the first semiconductor chip, the second semiconductor chip exposing the first region, a first signal connector on a top surface of the first region of the first semiconductor chip, the first signal connector being coupled to the first semiconductor chip, a second signal connector on the top surface of the first region of the first semiconductor chip, the second signal connector being coupled to the second semiconductor chip, and a third connector for power or ground on the top surface of the second region of the first semiconductor chip, the third connector being coupled to the substrate.

BRIEF DESCRIPTION OF THE DRAWINGS

Features will become apparent to those of skill in the art by describing in detail example embodiments with reference to the attached drawings in which.

DETAILED DESCRIPTION

Figure 1A:
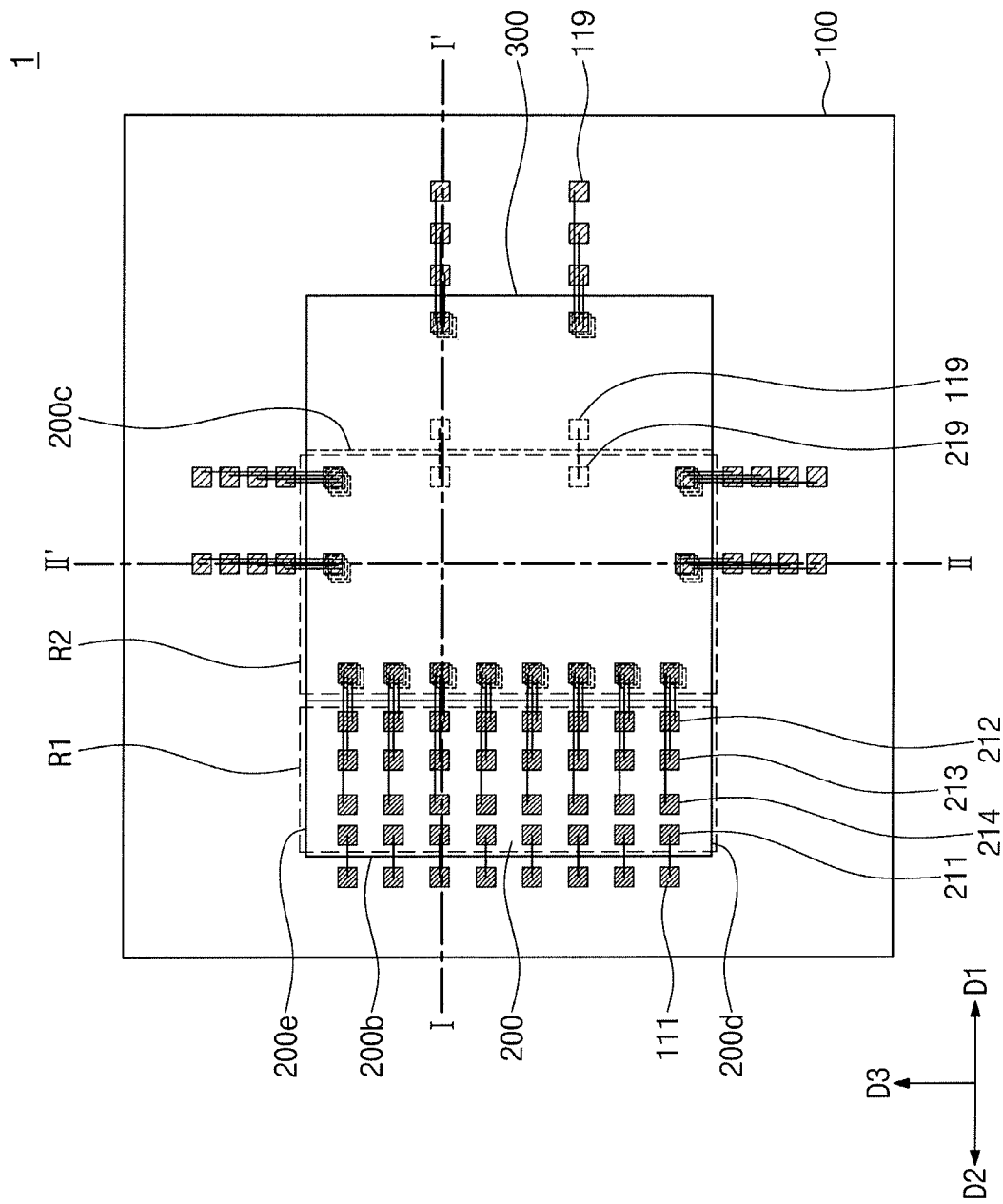
FIG. 1A illustrates a plan view showing a semiconductor package according to example embodiments.

In this description, like reference numerals may indicate like components.

Semiconductor packages according to example embodiments will now be described below.

Figure 1B:
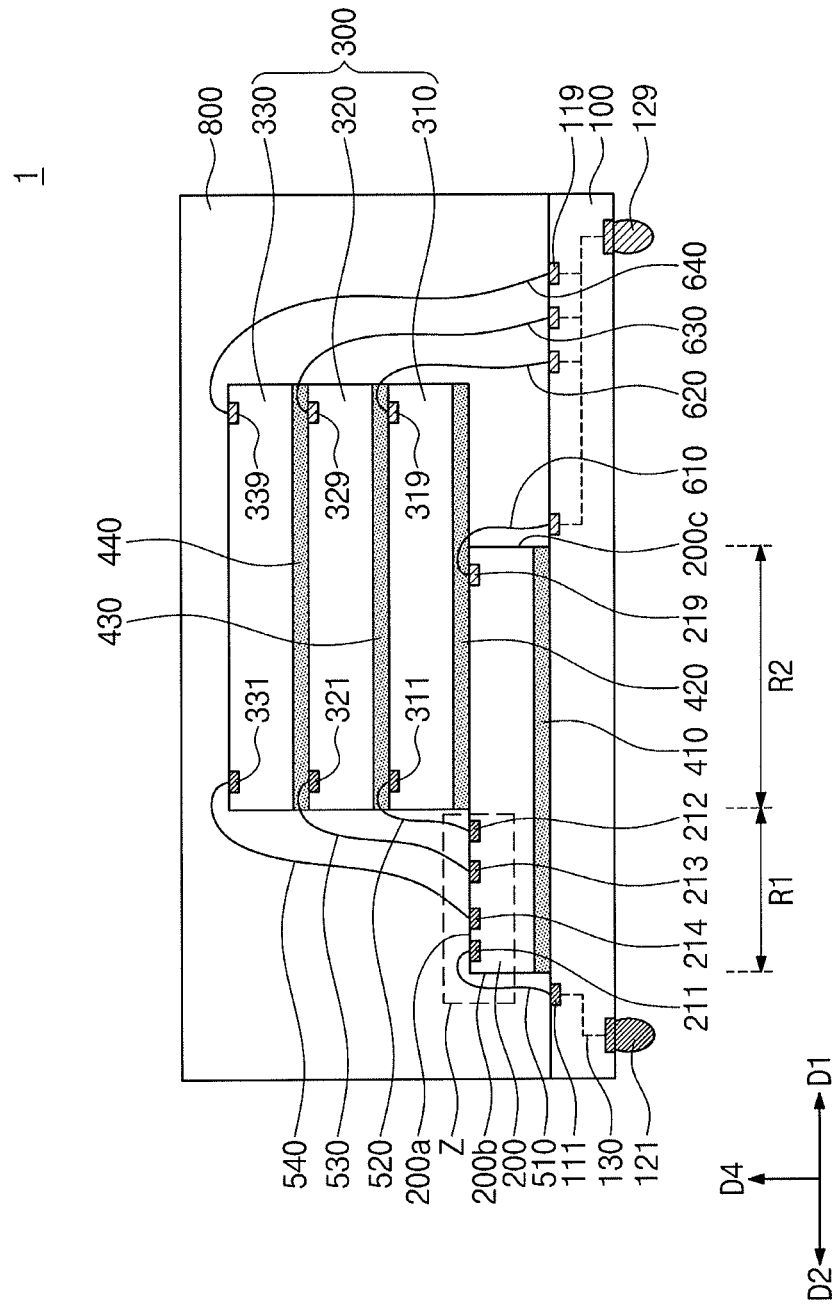
FIG. 1B illustrates a cross-sectional view taken along line I-I' of FIG. 1A.
Figure 1C:
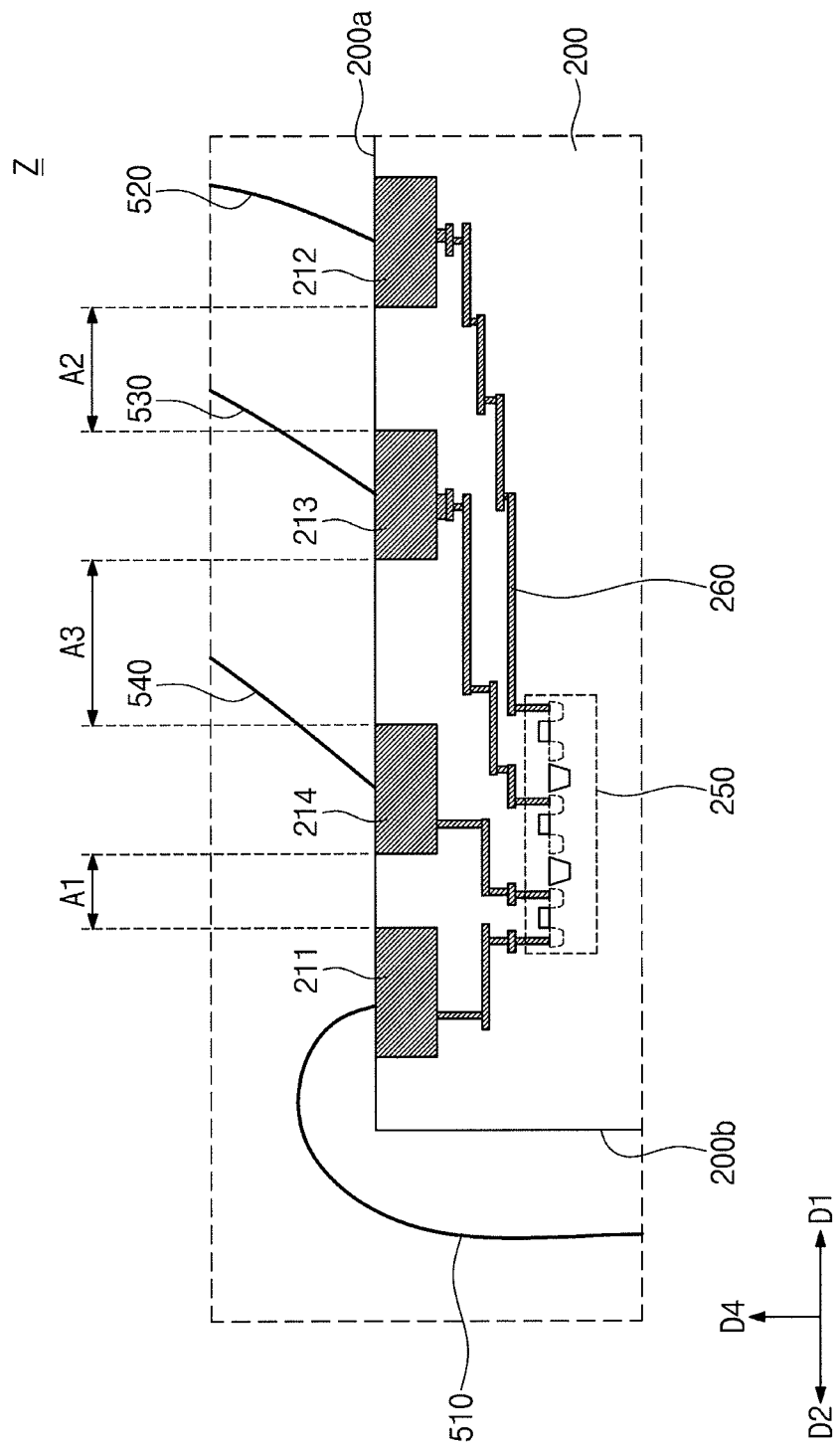
FIG. 1C illustrates an enlarged view showing section Z of FIG. 1B.
Figure 1D:
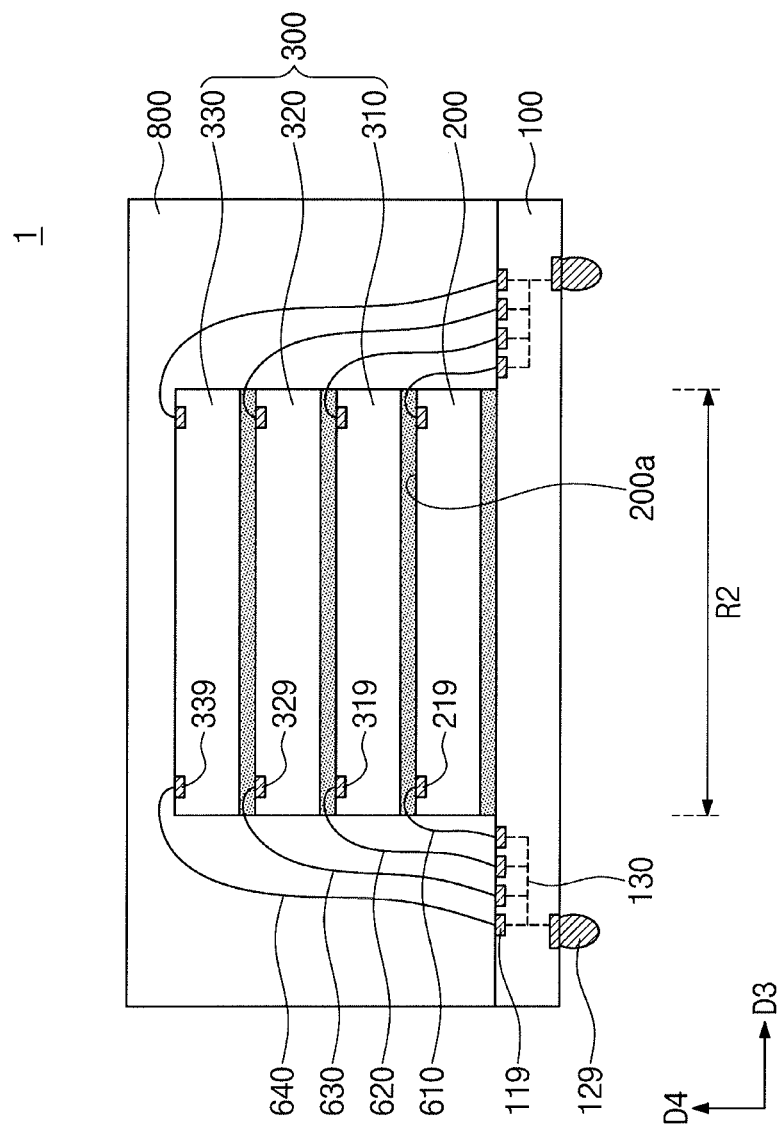
FIG. 1D illustrates a cross-sectional view taken along line II-IF of FIG. 1A.
Figure 1E:
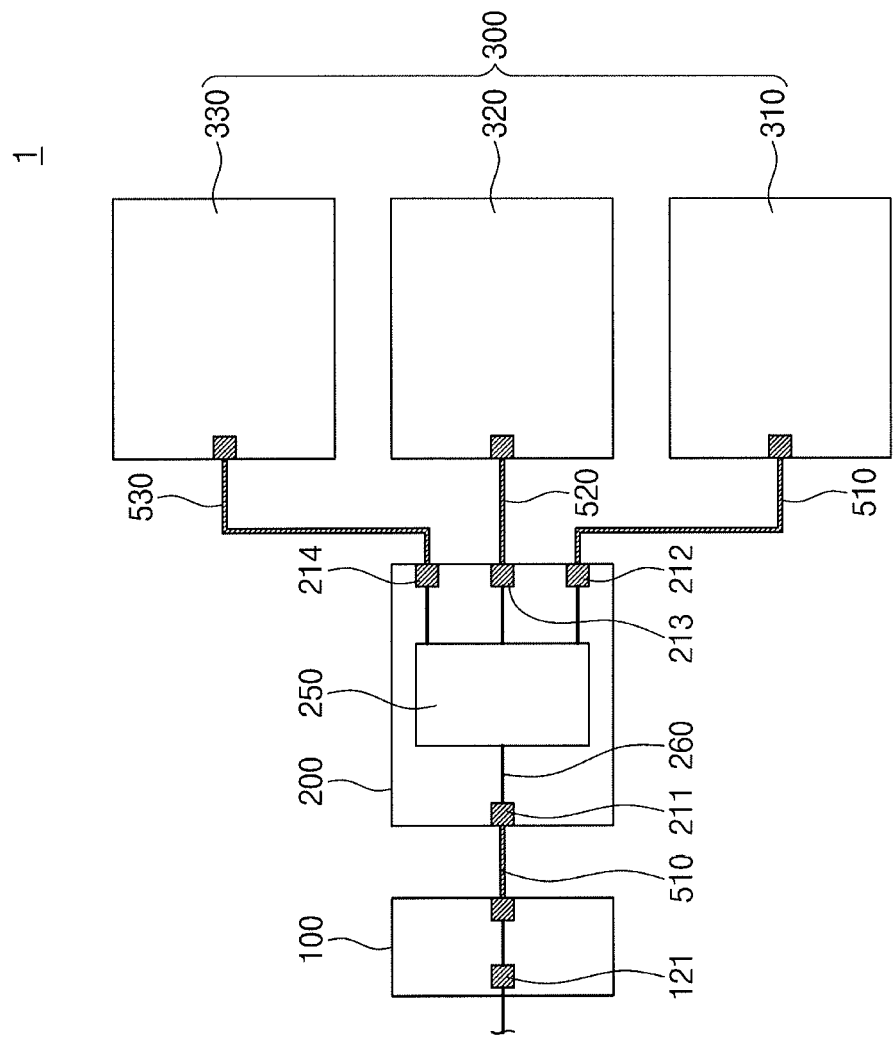
FIG. 1E illustrates a schematic diagram showing signal connection of a semiconductor package according to an example embodiment.

FIG. 1A illustrates a plan view showing a semiconductor package according to an example embodiment. FIG. 1B illustrates a cross-sectional view taken along line I-I' of FIG. 1A. FIG. 1C illustrates an enlarged view showing section Z of FIG. 1B. FIG. 1D illustrates a cross-sectional view taken along line II-IF of FIG. 1A. FIG. 1E illustrates a schematic diagram showing signal connection of a semiconductor package according to an example embodiment.

In the figures, dotted lines schematically indicate wiring lines within a substrate 100. In the figures, a first direction D1, a second direction D2, and a third direction D3 may be defined parallel to the top surface of the substrate 100. The second direction D2 may be opposite to the first direction D1. The third direction D3 may intersect the first and second directions D1 and D2. A fourth direction D4 may be substantially perpendicular to the top surface of the substrate 100.

Referring to FIGS. 1A and 1B, a semiconductor package 1 may include the substrate 100, a first semiconductor chip 200, a second semiconductor chip 300, and a molding layer 800.

The substrate 100 may include a printed circuit board. The substrate 100 may be provided on its top surface with connection pads 111 and 119. The connection pads 111 and 119 may include signal connection pads 111 and power/ground connection pads 119. The signal connection pads 111 may be spaced apart from and electrically insulated from the power/ground connection pads 119.

As illustrated in FIG. 1B, the substrate 100 may be provided on its bottom surface with terminals 121 and 129. The terminals 121 and 129 may include signal terminals 121 and power/ground terminals 129 electrically insulated from the signal terminals 121.

The signal connection pads 111 may be electrically connected through wiring lines to corresponding signal terminals 121. The power/ground terminals 129 may be electrically connected through wiring lines to corresponding power/ground connection pads 119.

Each of the signal terminals 121 and the power/ground terminals 129 may include a solder ball. The terminals 121 and 129 may be coupled to an external device. An external electrical signal and/or data (referred to hereinafter as signals) may be transmitted to and from the signal connection pad 111 through the signal terminal 121. The power/ground connection pad 119 may be supplied with a ground voltage or a power voltage through the power/ground terminal 129. The connection pads 111 and 119 and the terminals 121 and 129 may include a conductive material such as metal.

The first semiconductor chip 200 may be disposed on the substrate 100. The first semiconductor chip may generate clock signals. The first semiconductor chip 200 may have a top surface 200a, a first side surface 200b, a second side surface 200c, a third side surface 200d, and a fourth side surface 200e.

Each of the first to fourth side surfaces 200b, 200c, 200d, and 200e of the first semiconductor chip 200 may be parallel to the fourth direction D4. The second side surface 200c of the first semiconductor chip 200 may face the first side surface 200b of the first semiconductor chip 200. The fourth side surface 200e of the first semiconductor chip 200 may face the third side surface 200d of the first semiconductor chip 200. When viewed in plan view, the first semiconductor chip 200 may have a first region R1 and a second region R2. The first semiconductor chip 200 may be configured such that the first region R1 is adjacent to the first side surface 200b and the second region R2 is closer than the first region R1 to the second side surface 200c.

The first semiconductor chip 200 may include, on its top surface 200a, signal pads 211, 212, 213, and 214, and power/ground pads 219. The signal pads 211, 212, 213, and 214 may be disposed on the first region R1 of the first semiconductor chip 200. A first signal connector 510 may be provided on a top surface 200a of the first region R1 of the first semiconductor chip 200 and be coupled to the signal connection pad 111 of the substrate 100. The first signal connector 510 may include a bonding wire. The bonding wire may include metal such as gold or aluminum. The power/ground pads 219 may be provided on the second region R2 of the first semiconductor chip 200. The power/ground pads 219 may be insulated from the signal pads 211, 212, 213, and 214.

The second semiconductor chip 300 may be disposed on the first semiconductor chip 200. The second semiconductor chip 300 may include therein integrated circuits, which integrated circuits may include memory circuits. The second semiconductor chip 300 may cover the second region R2 of the first semiconductor chip 200. The second semiconductor chip 300 may be stacked on the first semiconductor chip 200, which arrangement may reduce a size of the semiconductor package 1. The second semiconductor chip 300 may expose the first region R1 of the first semiconductor chip 200. The second semiconductor chip 300 may have the same size and shape as those of the first semiconductor chip 200. In this description, the phrase "the same size and shape" may include a tolerable error possibly occurring in a manufacturing process. The second semiconductor chip 300 may have the same storage capacity as that of the first semiconductor chip 200. In contrast, the second semiconductor chip 300 may perform a different function from that of the first semiconductor chip 200.

The second semiconductor chip may receive clock signals generated in a first semiconductor chip. For example, the first semiconductor chip 200 may read data from or write data to the second semiconductor chip 300. The second semiconductor chip 300 may respond to the request from the first semiconductor chip 200.

The first semiconductor chip 200 may have the same size and shape as those of the second semiconductor chip 300. Thus, the second semiconductor chip 300 may be easily stacked on the first semiconductor chip 200.

The semiconductor package 1 may include a plurality of stacked second semiconductor chips 300. For example, the total number of the first semiconductor chip 200 and the second semiconductor chips 300 may be 2n (where, n is a natural number equal to or greater than 1). The second semiconductor chips 300 may be aligned with each other parallel to the fourth direction D4. The semiconductor package 1 may thus be compact in size. In another implementation, the second semiconductor chips 300 may not be aligned with each other parallel to the fourth direction D4. The second semiconductor chips 300 may include a first second semiconductor chip 310, a second second semiconductor chip 320, and a third second semiconductor chip 330 that are stacked. As discussed above, each of the first to third second semiconductor chips 310, 320, and 330 may have the same size and shape as those of the first semiconductor chip 200. Each of the first to third second semiconductor chips 310, 320, and 330 may have the same storage capacity as that of the first semiconductor chip 200.

The first second semiconductor chip 310 may include a first signal chip pad 311 and a first power/ground chip pad 319. The first signal chip pad 311 and the first power/ground chip pad 319 may be exposed on a top surface of the first second semiconductor chip 310. When viewed in plan view, the first signal chip pad 311 may be closer than the first power/ground chip pad 319 to the first side surface 200b of the first semiconductor chip 200. A second signal connector 520 may be provided on and connected to the first second semiconductor chip 310 and the first semiconductor chip 200. For example, the second signal connector 520 may be coupled to the first signal chip pad 311 of the first second semiconductor chip 310. The second signal connector 520 may include a bonding wire.

The second second semiconductor chip 320 may include a second signal chip pad 321 and a second power/ground chip pad 329 that are provided on a top surface of the second second semiconductor chip 320. When viewed in plan view, the second signal chip pad 321 may be closer than the second power/ground chip pad 329 to the first side surface 200b of the first semiconductor chip 200. A third signal connector 530 may be provided on the second second semiconductor chip 320 and the first semiconductor chip 200. The third signal connector 530 may be connected to the second signal chip pad 321 and the first semiconductor chip 200. The third signal connector 530 may include a bonding wire.

The third second semiconductor chip 330 may include a third signal chip pad 331 and a third power/ground chip pad 339 that are provided on a top surface of the third second semiconductor chip 330. When viewed in plan view, the third signal chip pad 331 may be closer than the third power/ground chip pad 339 to the first side surface 200b of the first semiconductor chip 200. A fourth signal connector 540 may be provided on the third second semiconductor chip 330 and the first semiconductor chip 200 to come into connection with the third signal chip pad 331 of the third second semiconductor chip 330. The fourth signal connector 540 may include a bonding wire.

The first to fourth signal connectors 510, 520, 530, and 540 may be disposed outside the first semiconductor chip 200 and the first to third second semiconductor chips 310, 320, and 330. Each of the first semiconductor chip 200, the first second semiconductor chip 310, and the second second semiconductor chip 320 may include therein no through electrode for electrical connection. Since the formation of the through electrode may be omitted, the first semiconductor chip 200, the first second semiconductor chip 310, and the second second semiconductor chip 320 may be formed in high yield. The following describes in detail signal connection between the substrate 100, the first semiconductor chip 200, and the second semiconductor chips 300.

Referring to FIG. 1E, the substrate 100 may transmit and receive external electrical signals. The first semiconductor chip 200 may include therein an integrated circuit section 250 and internal wiring lines 260. The integrated circuit section 250 may include devices such as transistors. The integrated circuit section 250 may serve as a buffer circuit. In another implementation, the integrated circuit section 250 may serve as a controller circuit. The internal wiring lines 260 may be electrically connected to the integrated circuit section 250. The integrated circuit section 250 of the first semiconductor chip 200 may be electrically connected through the signal pad 211 and the first signal connector 510 to the substrate 100 (e.g., to the signal terminal 121). The first semiconductor chip 200 may communicate signals with the substrate 100 without passing through other semiconductor chips. In this description, the phrase "an electrical connection of the semiconductor chip" may mean an electrical connection of the integrated circuit section. The second semiconductor chips 300 may communicate signals with the substrate 100 through the integrated circuit section 250 of the first semiconductor chip 200. The second semiconductor chips 300 may include the first second semiconductor chip 310, the second second semiconductor chip 320, and the third second semiconductor chip 330. No signals may be directly communicated between the first to third second semiconductor chips 310, 320, and 330.

As illustrated in FIGS. 1B, 1C, and 1E, the signal pads 211, 212, 2143, and 214 may include a first signal pad 211, a second signal pad 212, a third signal pad 213, and a fourth signal pad 214 that are spaced apart from each other. The first signal pad 211 may be electrically connected through the first signal connector 510 to the signal connection pad 111 of the substrate 100. The second signal connector 520 may be coupled to the second signal pad 212. The first to fourth signal pads 211, 212, 213, and 214 may be connected through the internal wiring lines 260 to the integrated circuit section 250. The second signal pad 212 may be electrically connected through the integrated circuit section 250 to the first signal pad 211. In such a configuration, the first second semiconductor chip 310 may communicate signals with an external device through the signal terminal 121 and the integrated circuit section 250 of the first semiconductor chip 200. Likewise, the third signal connector 530 may be coupled to the third signal pad 213. The second second semiconductor chip 320 may be electrically connected to the signal terminal 121 through the third signal pad 213, the integrated circuit section 250, and the first signal pad 211. The fourth signal connector 540 may be coupled to the fourth signal pad 214. The third second semiconductor chip 330 may be electrically connected to the signal terminal 121 through the fourth signal pad 214, the integrated circuit section 250, and the first signal pad 211.

According to an example embodiment, each of the first to third second semiconductor chips 310, 320, and 330 may have the same storage capacity as that of the first semiconductor chip 200. Thus, the numbers of the first to third signal chip pads 311, 321, and 331 may easily correspond to the numbers of the second to fourth signal pads 212, 213, and 214, respectively. The first to third signal chip pads 311, 321, and 331 may have their arrangement easily corresponding to those of the second to fourth signal pads 212, 213, and 214, respectively. The first to third second semiconductor chips 310, 320, and 330 may thus be easily electrically connected to the first semiconductor chip 200.

According to an example embodiment, the arrangement of the signal pads 211, 212, 213, and 214 may be adjusted to prevent an electrical short between the signal connectors 510, 520, 530, and 540. As illustrated in FIGS. 1A, 1B, and 1C, when viewed in plan view, the first signal connector 510 may extend in the second direction D2 from the first signal pad 211, and each of the second to fourth signal connectors 520, 530, and 540 may extend in the first direction D1, respectively, from the second to fourth signal pads 212, 213, and 214. When viewed in plan view, the first signal pad 211 may be closer than the second to fourth signal pads 212, 213, and 214 to the first side surface 200b of the first semiconductor chip 200. The first signal connector 510 may thus be spaced apart from the second to fourth signal connectors 520, 530, and 540, which arrangement may prevent the first signal connector 510 from an electrical short with the second to fourth signal connectors 520, 530, and 540. The fourth signal pad 214 may be closer than the second and third signal pads 212 and 213 to the first side surface 200b of the first semiconductor chip 200. The third signal pad 213 may be closer than the second signal pad 212 to the first side surface 200b of the first semiconductor chip 200. The second to fourth signal connectors 520, 530, and 540 may therefore avoid electrical short therebetween.

According to an example embodiment, intervals between the signal pads 211, 212, 213, and 214 may be adjusted to prevent an electrical short between the signal connectors 510, 520, 530, and 540. As illustrated in FIG. 1C, the first and fourth signal pads 211 and 214 may be spaced apart from each other at a first interval A1. The second and third signal pads 212 and 213 may be spaced apart from each other at a second interval A2. The third and fourth signal pads 213 and 214 may be spaced apart from each other at a third interval A3. Separating the third and fourth signal connectors 530 and 540 from each other may pose a challenge. In some embodiments, the third interval A3 may be greater than each of the first and second intervals A1 and A2. The third and fourth signal connectors 530 and 540 may then be easily spaced apart from each other, which configuration may prevent an electrical short between the third and fourth signal connectors 530 and 540. When viewed in plan view, the first signal connector 510 may extend in the second direction D2 from the first signal pad 211. Thus, the first signal connector 510 may be more easily spaced apart from the second to fourth signal connectors 520, 530, and 540. The first interval A1 may be less than each of the second and third intervals A2 and A3. The third interval A3 may thus be sufficiently large to prevent contact between the third and fourth signal connectors 530 and 540. The intervals between the signal pads 211, 212, 213, and 214 may be variously changed.

The first to fourth signal pads 211, 212, 213, and 214 may be aligned with each other along the first direction D1. Referring to FIG. 1A, a plurality of first signal pads 211 may be provided aligned with each other parallel to the third direction D3. A plurality of second signal pads 212 may be provided. The second signal pads 212 may be aligned with each other parallel to the third direction D3. A plurality of third signal pads 213 may be provided aligned with each other parallel to the third direction D3. A plurality of fourth signal pads 214 may be provided aligned with each other parallel to the third direction D3. The planar arrangement of the signal pads 211, 212, 213, and 214 may be varied.

The integrated circuit section 250 within the first semiconductor chip 200 may have various arrangements. For example, when viewed in plan, the integrated circuit section 250 may illustrated to overlap the first and fourth signal pads 211 and 214, etc.

The power/ground pads 219 may be closer than the signal pads 211, 212, 213, and 214 to one of the second to fourth side surfaces 200c, 200d, and 200e of the first semiconductor chip 200.

As illustrated in FIGS. 1A, 1B, and 1D, a first power/ground connector 610 may be provided on the top surface 200a of the second region R2 of the first semiconductor chip 200 and be coupled to the power/ground pad 219.

A second power/ground connector 620 may be provided on the first second semiconductor chip 310 and coupled to the first power/ground chip pad 319. The second power/ground connector 620 may be coupled to one of the power/ground connection pads 119. The second power/ground connector 620 may be spaced apart from the first semiconductor chip 200. The first second semiconductor chip 310 may be electrically grounded or supplied with power without passing through the integrated circuit section 250 of the first semiconductor chip 200.

A third power/ground connector 630 may be provided on the second second semiconductor chip 320 and be coupled to the third power/ground chip pad 339. The third power/ground connector 630 may be coupled to one of the power/ground connection pads 119. The third second semiconductor chip 330 may be provided thereon with a fourth power/ground connector 640 coupled to the third power/ground chip pad 339. The fourth power/ground connector 640 may be coupled to one of the power/ground connection pads 119. The third and fourth power/ground connectors 630 and 640 may be spaced apart from the first semiconductor chip 200. The second and third second semiconductor chips 320 and 330 may be coupled to the power/ground connection pads 119 of the substrate 100 without passing through the integrated circuit section 250 of the first semiconductor chip 200. The power/ground pad 219, the first to third power/ground chip pads 319, 329, and 339, and the first to fourth power/ground connectors 610, 620, 630, and 640 may be variously changed in electrical connection and arrangement.

A first adhesive layer 410 may be interposed between the substrate 100 and the first semiconductor chip 200. A second adhesive layer 420 may be provided between the first second semiconductor chip 310 and the top surface 200a of the second region R2 of the first semiconductor chip 200. The second adhesive layer 420 may extend along a bottom surface of the first second semiconductor chip 310. The second signal connector 520 and the second power/ground connector 620 may penetrate the second adhesive layer 420. The second adhesive layer 420 may not extend onto the first region R1 of the first semiconductor chip 200, thereby exposing the signal pads 211, 212, 213, and 214. A third adhesive layer 430 may be interposed between the first second semiconductor chip 310 and the second second semiconductor chip 320. A fourth adhesive layer 440 may be interposed between the second second semiconductor chip 320 and the third second semiconductor chip 330. The adhesive layers 410, 420, 430, and 440 may include an insulating polymer.

The molding layer 800 may be provided on the substrate 100 to cover the first semiconductor chip 200, the second semiconductor chips 300, and the connectors 510, 520, 530, 540, 610, 620, 630, and 640. The molding layer 800 may include an insulating polymer such as an epoxy-based molding compound.

The number of stacked second semiconductor chips 300 may be variously changed. For example, one or more of the second and third second semiconductor chips 320 and 330 may be omitted. When the second second semiconductor chip 320 is omitted, none of the third signal pad 213, the third signal connector 530, and the third power/ground connector 630 may be provided. Likewise, when the third second semiconductor chip 330 is omitted, none of the fourth signal pad 214, the fourth signal connector 540, and the fourth power/ground connector 640 may be provided.

Figure 2A:
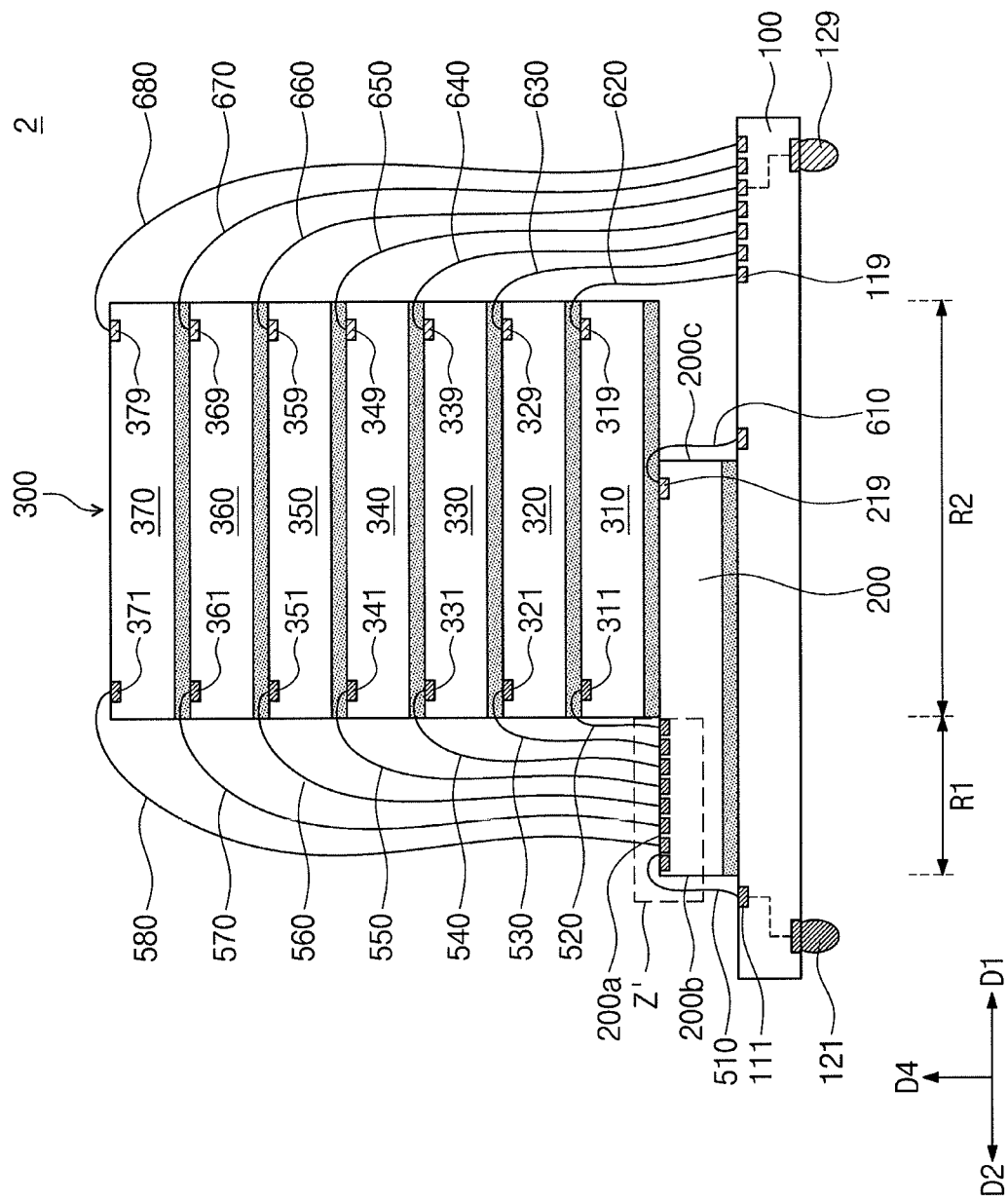
FIG. 2A illustrates a cross-sectional view showing a semiconductor package according to an example embodiment.
Figure 2B:
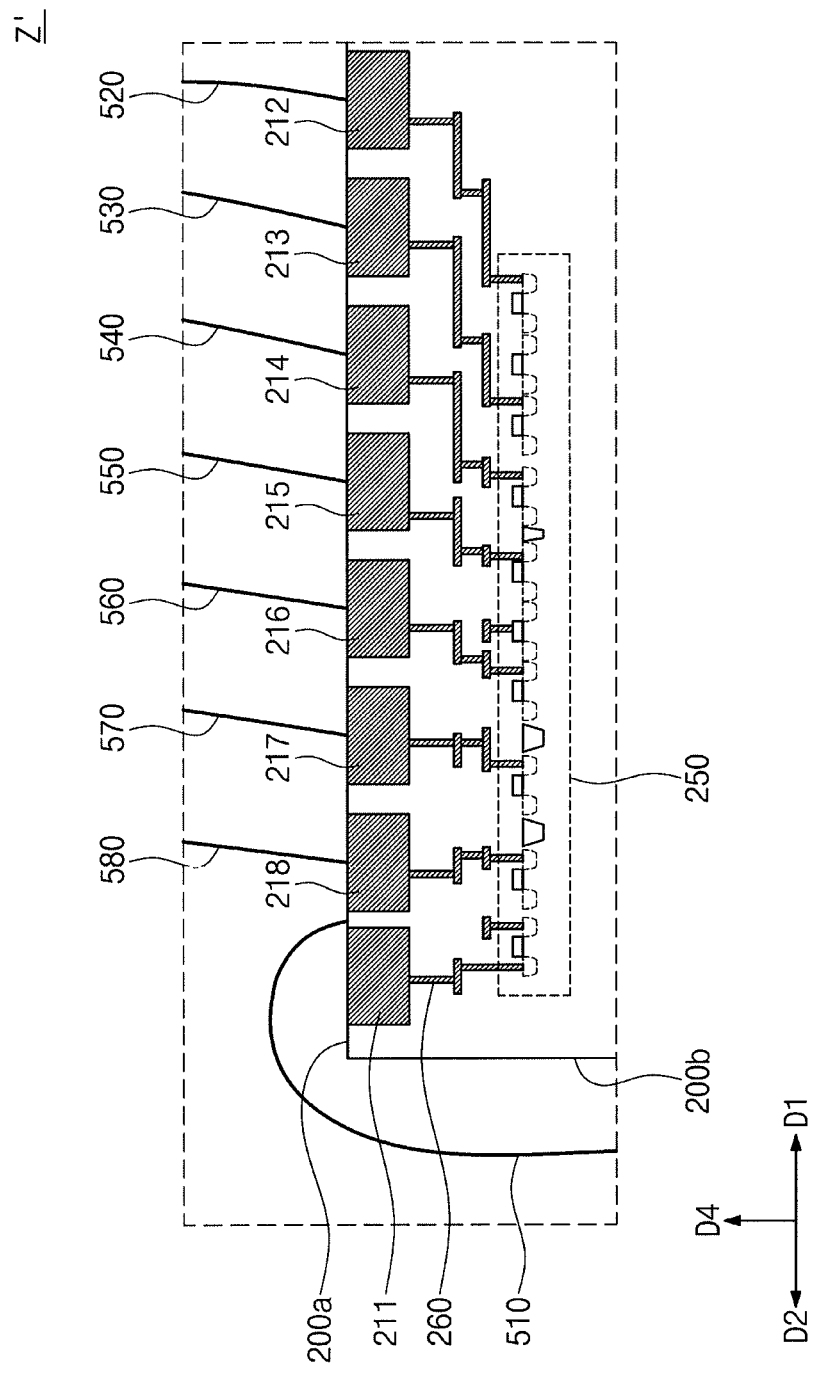
FIG. 2B illustrates an enlarged view showing section Z' of FIG. 2A.

FIG. 2A illustrates a cross-sectional view taken along line I-I' of FIG. 1A, showing a semiconductor package according to an example embodiment. FIG. 2B illustrates an enlarged view showing section Z' of FIG. 2A. Descriptions set forth above may not be repeated hereinafter.

Referring to FIGS. 1A, 2A, and 2B, a semiconductor package 2 may include the substrate 100, the first semiconductor chip 200, the second semiconductor chips 300, and the molding layer 800. The second semiconductor chip 300 may further include a fourth second semiconductor chip 340, a fifth second semiconductor chip 350, a sixth second semiconductor chip 360, and a seventh second semiconductor chip 370 in addition to the first to third second semiconductor chips 310, 320, and 330. The substrate 100, the first semiconductor chip 200, and the first to third second semiconductor chips 310, 320, and 330 may be substantially the same as those discussed above with reference to FIGS. 1A to 1E. Each of the fourth to seventh second semiconductor chips 340, 350, 360, and 370 may have the same size and shape as those of the first semiconductor chip 200. Each of the fourth to seventh second semiconductor chips 340, 350, 360, and 370 may have the same storage capacity as that of the first semiconductor chip 200.

The first semiconductor chip 200 may further have fifth to eighth signal pads 215, 216, 217, and 218 in addition to the first to fourth signal pads 211, 212, 213, and 214. As illustrated in FIG. 2B, the fifth to eighth signal pads 215, 216, 217, and 218 may be electrically connected to the integrated circuit section 250 through the internal wiring lines 260 of the first semiconductor chip 200. A fifth signal connector 550 may be provided on the fourth second semiconductor chip 340 and be coupled to the fifth signal pad 215 and a signal chip pad 341 of the fourth second semiconductor chip 340. A sixth signal connector 560 may be coupled to the sixth signal pad 216 and a signal chip pad 351 of the fifth second semiconductor chip 350. A seventh signal connector 570 may be coupled to the seventh signal pad 217 and a signal chip pad 361 of the sixth second semiconductor chip 360. An eighth signal connector 580 may be coupled to the eighth signal pad 218 and a signal chip pad 371 of the seventh second semiconductor chip 370. The fourth to seventh second semiconductor chips 340, 350, 360, and 370 may communicate signals with the substrate 100 through the integrated circuit section 250 of the first semiconductor chip 200. The fifth to eighth signal connectors 550, 560, 570, and 580 may be bonding wires.

As illustrated in FIG. 2A, the fourth to seventh second semiconductor chips 340, 350, 360, and 370 may have respective power/ground chip pads 349, 359, 369, and 379, each of which is electrically connected to a corresponding one of fifth to eighth power/ground connectors 650, 660, 670, and 680. The fifth to eighth power/ground connectors 650, 660, 670, and 680 may be coupled to power/ground connection pads 119. The fifth to eighth power/ground connectors 650, 660, 670, and 680 may be bonding wires. The first to seventh second semiconductor chips 310, 320, 330, 340, 350, 360, and 370 may be electrically grounded or supplied with power without passing through the integrated circuit section 250 of the first semiconductor chip 200.

Figure 2C:
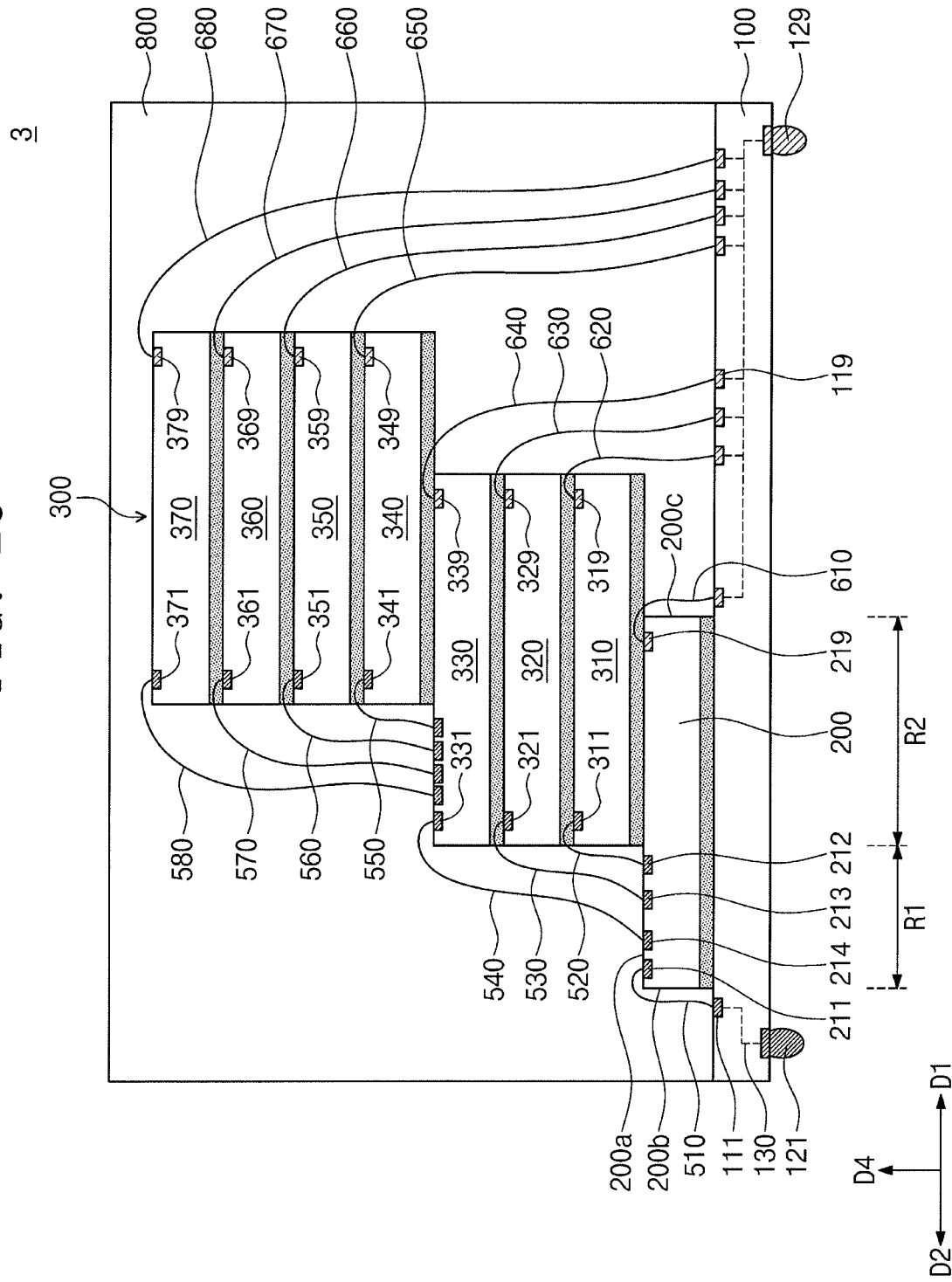
FIG. 2C illustrates a cross-sectional view showing a semiconductor package according to an example embodiment.

FIG. 2C illustrates a cross-sectional view showing a semiconductor package according to an example embodiment. Descriptions set forth above may not be repeated hereinafter.

Referring to FIG. 2C, a semiconductor package 3 may include the substrate 100, the first semiconductor chip 200, the second semiconductor chips 300, the first to eighth signal connectors 510, 520, 530, 540, 550, 560, 570, and 580, the first to eighth power/ground connectors 610, 620, 630, 640, 650, 660, 670, and 680, and the molding layer 800. The substrate 100, the first semiconductor chip 200, the first to third second semiconductor chips 310, 320, and 330, the first to fourth signal connectors 510, 520, 530, and 540, and the first to fourth power/ground connectors 610, 620, 630, and 640 may be substantially the same as those discussed above with reference to FIGS. 1A to 1E.

When viewed in plan view, each of the fourth to seventh second semiconductor chips 340, 350, 360, and 370 may be shifted in the first direction D1 from the third second semiconductor chip 330. The fifth signal connector 550 may be coupled to the signal chip pad 331 of the third second semiconductor chip 330 and to the signal chip pad 341 of the fourth second semiconductor chip 340. The fourth second semiconductor chip 340 may be coupled through the third second semiconductor chip 330 and the fourth signal connector 540 to the integrated circuit section 250 of the first semiconductor chip 200. Likewise, the sixth to eighth signal connectors 560, 570, and 580 may be coupled respectively to the fifth to seventh second semiconductor chips 350, 360, and 370. Each of the fifth to seventh second semiconductor chips 350, 360, and 370 may be coupled through the third second semiconductor chip 330 and the fourth signal connector 540 to the integrated circuit section 250 of the first semiconductor chip 200.

Figure 3:
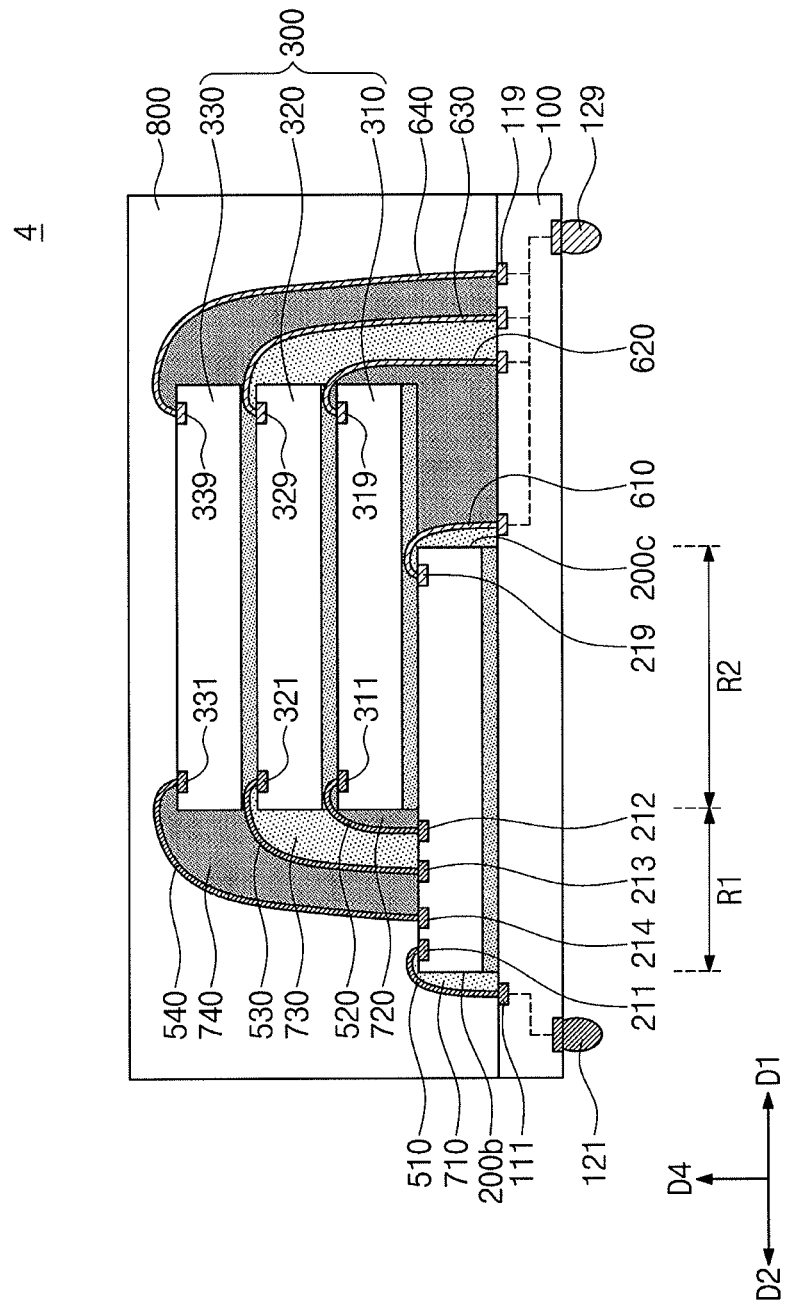
FIG. 3 illustrates a cross-sectional view showing a semiconductor package according to an example embodiment.

FIG. 3 illustrates a cross-sectional view taken along line I-I' of FIG. 1A, showing a semiconductor package according to an example embodiment. Descriptions set forth above may not be repeated hereinafter.

Referring to FIGS. 1A and 3, a semiconductor package 4 may further include a first insulation pattern 710, a second insulation pattern 720, a third insulation pattern 730, and a fourth insulation pattern 740 in addition to the substrate 100, the first semiconductor chip 200, the second semiconductor chips 300, and the molding layer 800. The first to fourth insulation patterns 710, 720, 730, and 740 may include an insulating polymer (e.g., an epoxy-based polymer). The first to fourth signal connectors 510, 520, 530, and 540 and the first to fourth power/ground connectors 610, 620, 630, and 640 may be wiring line patterns.

The first insulation pattern 710 may be provided on substrate 100 to cover the first and second side surfaces 200b and 200c and a portion of the top surface 200a of the first semiconductor chip 200. The first insulation pattern 710 may expose the signal pads 211, 212, 213, and 214 and the power/ground connection pads 119.

The first signal connector 510 and the first power/ground connector 610 may be provided on first insulation pattern 710 to cover the first insulation pattern 710. For example, wiring line patterns may be formed on the first insulation pattern 710, which wiring line patterns serve as the first signal connector 510 and the first power/ground connector 610. The wiring line patterns may include metal such as copper. The first signal connector 510 may be coupled to the first signal pad 211 and the signal connection pad 111. The first power/ground connector 610 may be coupled to one of the power/ground connection pads 119 and to the power/ground pad 219. The first power/ground connector 610 may be spaced apart from the first signal connector 510.

The second insulation pattern 720 may be provided on the substrate 100, the first semiconductor chip 200, and the first insulation pattern 710, thereby covering the first signal connector 510, the first power/ground connector 610, and side surfaces of the first second semiconductor chip 310. The second insulation pattern 720 may further extend onto a portion of a top surface of the first second semiconductor chip 310. The second insulation pattern 720 may expose the second signal pad 212, the first signal chip pad 311, the first power/ground chip pad 319, and at least one of the power/ground connection pads 119. The second signal connector 520 and the second power/ground connector 620 may be provided on the second insulation pattern 720. For example, wiring line patterns may be formed on the second insulation pattern 720, which wiring line patterns serve as the second signal connector 520 and the second power/ground connector 620. The second signal connector 520 may be coupled to the second signal pad 212 and to the first signal chip pad 311. The second power/ground connector 620 may be coupled to one of the power/ground connection pads 119 and to the first power/ground chip pad 319. The second power/ground connector 620 may be spaced apart from the second signal connector 520.

The third insulation pattern 730 may be provided on the substrate 100 and the first semiconductor chip 200, thereby covering the second signal connector 520 and the second power/ground connector 620. The third insulation pattern 730 may further extend onto a portion of a top surface of the second second semiconductor chip 320. The third insulation pattern 730 may expose the third signal pad 213, the second signal chip pad 321, the second power/ground chip pad 329, and the power/ground connection pads 119. The third signal connector 530 and the third power/ground connector 630 may be provided on the third insulation pattern 730 to cover the third insulation pattern 730. For example, wiring line patterns may be formed on the third insulation pattern 730, which wiring line patterns serve as the third signal connector 530 and the third power/ground connector 630. The third signal connector 530 may be coupled to the third signal pad 213 and to the second signal chip pad 321. The third power/ground connector 630 may be coupled to one of the power/ground connection pads 119 and to the second power/ ground chip pad 329. The third power/ground connector 630 may be spaced apart from the third signal connector 530.

The fourth insulation pattern 740 may be provided on the substrate 100 and the first semiconductor chip 200 to cover the third signal connector 530 and the third power/ground connector 630. The fourth insulation pattern 740 may expose the fourth signal pad 214, the third signal chip pad 331, the third power/ground chip pad 339, and at least one of the power/ground connection pads 119. The fourth signal connector 540 and the fourth power/ground connector 640 may be provided on the fourth insulation pattern 740. In an example embodiment, wiring line patterns may be formed on the fourth insulation pattern 740, which wiring line patterns may serve as the fourth signal connector 540 and the fourth power/ground connector 640. The fourth signal connector 540 may be coupled to the fourth signal pad 214 and to the third signal chip pad 331. The fourth power/ground connector 640 may be coupled to one of the power/ground connection pads 119 and to the third power/ground chip pad 339. The fourth power/ground connector 640 may be spaced apart from the fourth signal connector 540.

The substrate 100, the first semiconductor chip 200, the second semiconductor chips 300, and the molding layer 800 may be substantially the same as those discussed above with reference to FIGS. 1A to 1E.

Figure 4A:
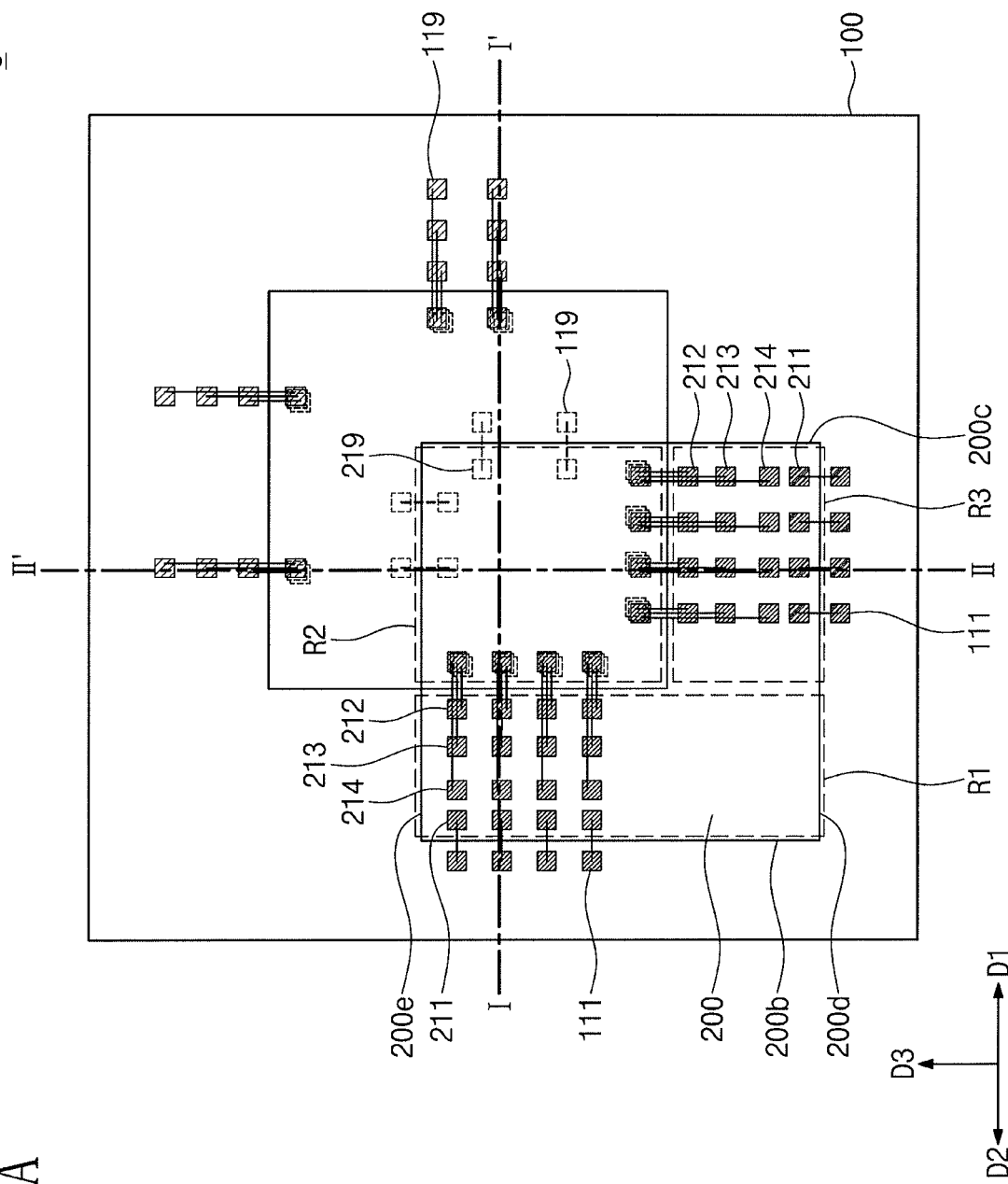
FIG. 4A illustrates a plan view showing a semiconductor package according to an example embodiment.
Figure 4B:
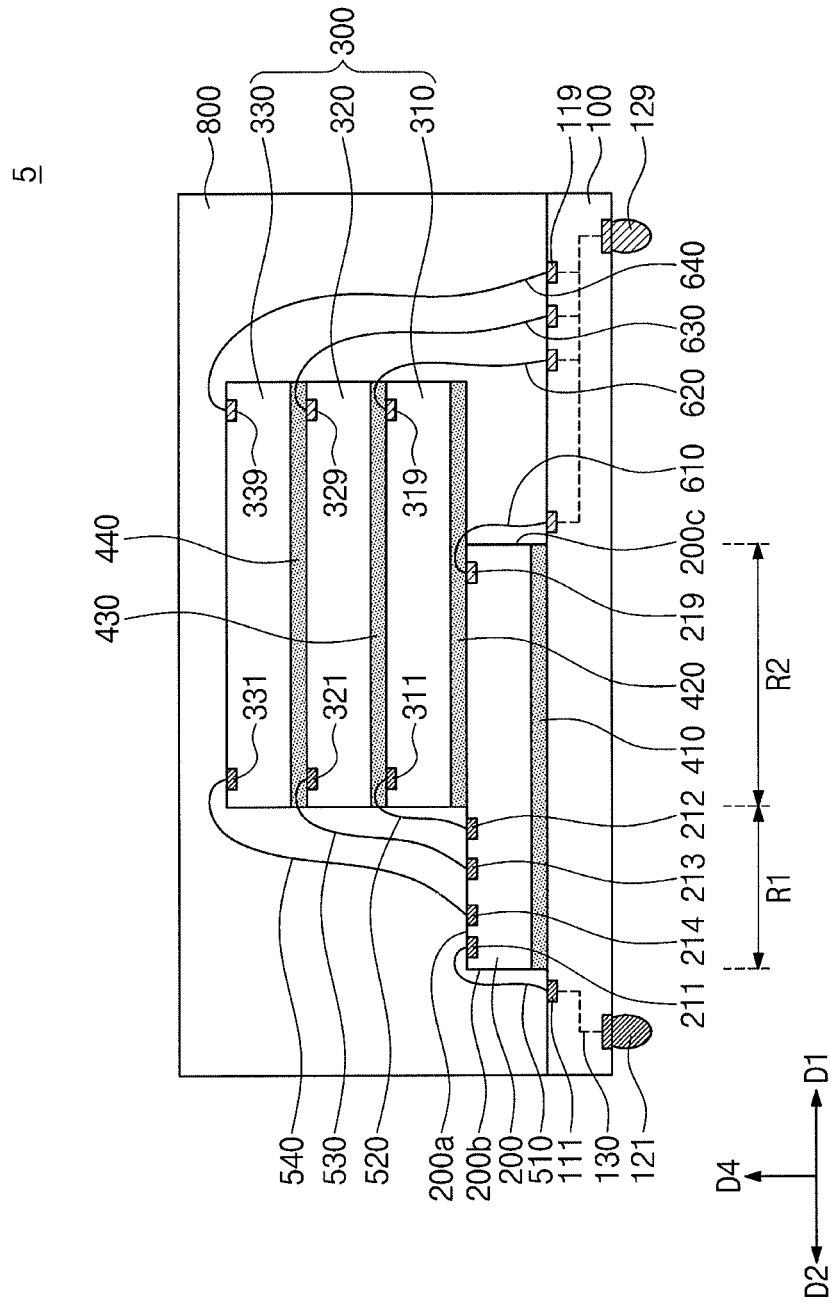
FIG. 4B illustrates a cross-sectional view taken along line I-I' of FIG. 4A.
Figure 4C:
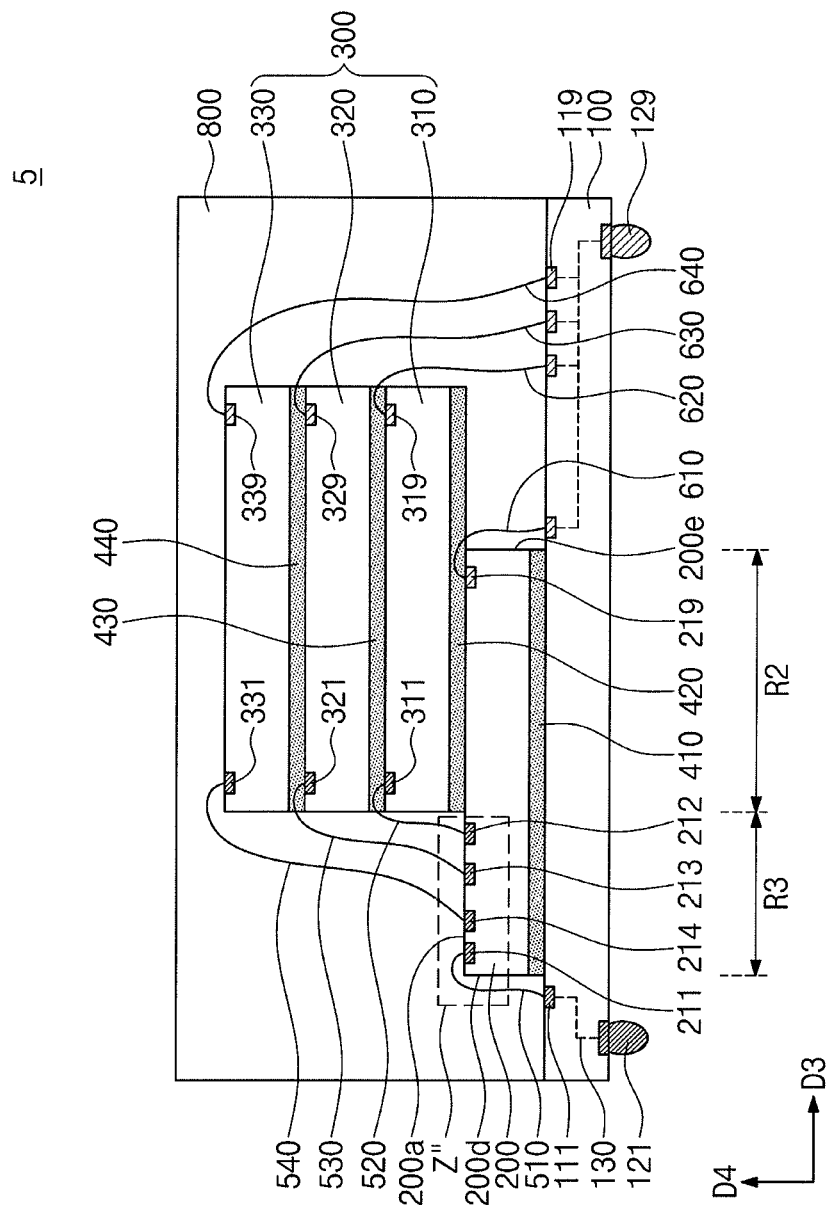
FIG. 4C illustrates a cross-sectional view taken along line II-IF of FIG. 4A.
Figure 4D:
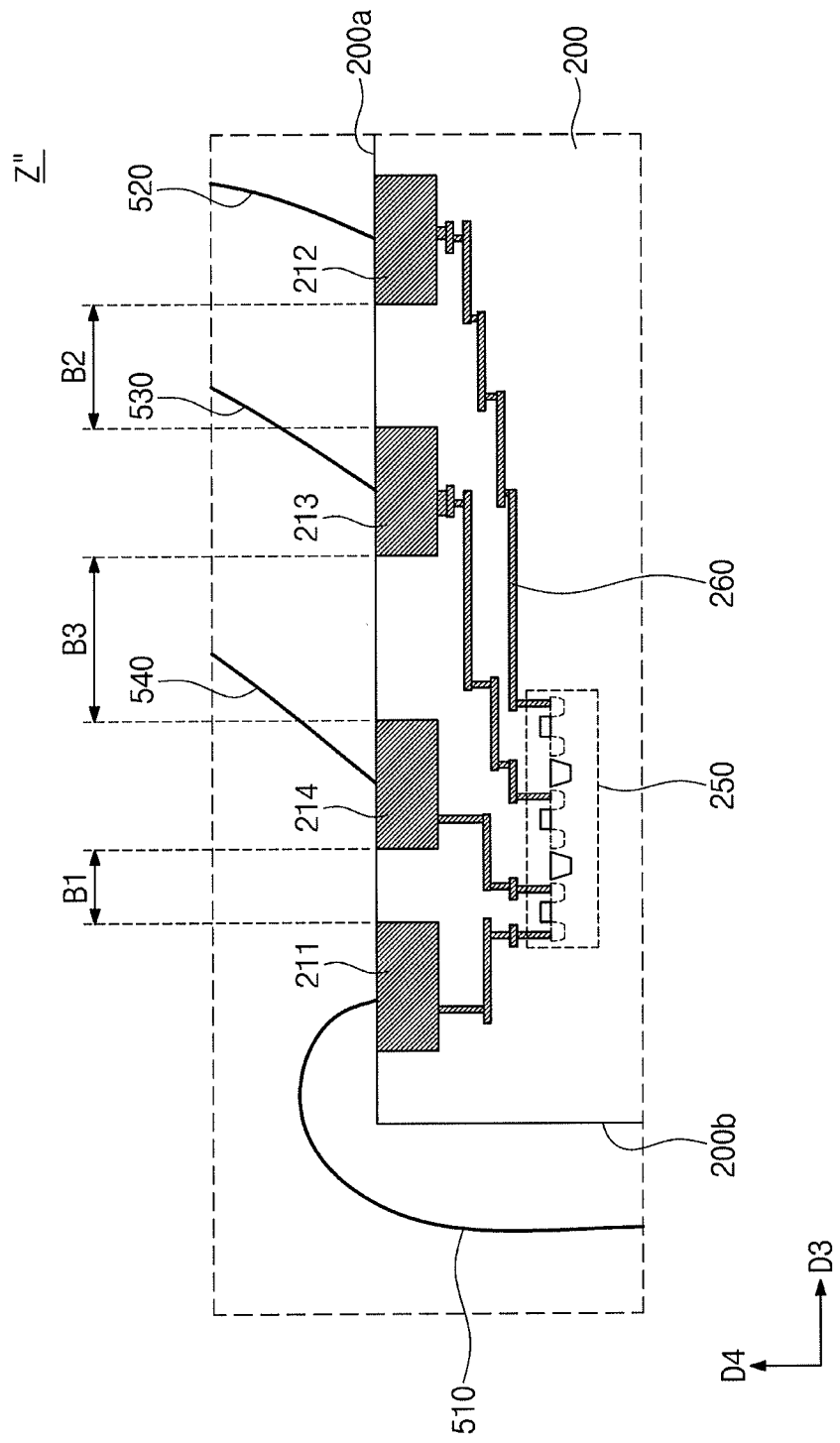
FIG. 4D illustrates an enlarged view showing section Z" of FIG. 4C.

FIG. 4A illustrates a plan view showing a semiconductor package according to an example embodiment. FIG. 4B illustrates a cross-sectional view taken along line I-I' of FIG. 4A. FIG. 4C illustrates a cross-sectional view taken along line II-IF of FIG. 4A. FIG. 4D illustrates an enlarged view showing section Z" of FIG. 4C. Descriptions set forth above may not be repeated hereinafter.

Referring to FIGS. 4A to 4C, a semiconductor package 5 may include the substrate 100, the first semiconductor chip 200, the second semiconductor chips 300, and the molding layer 800. The substrate 100, the first semiconductor chip 200, the second semiconductor chips 300, and the molding layer 800 may be substantially the same as those discussed above with reference to FIGS. 1A to 1E.

When viewed in plan view, the first semiconductor chip 200 may include a first region R1, a second region R2, and a third region R3. The first region R1 may be closer than the second region R2 to the first side surface 200b of the first semiconductor chip 200. The third region R3 may be closer than the second region R2 to the third side surface 200d of the first semiconductor chip 200.

The second semiconductor chip 300 may be disposed on the second region R2 of the first semiconductor chip 200. When viewed in plan view, the second semiconductor chip 300 may be shifted in the first direction D1 from the first semiconductor chip 200. As illustrated in FIGS. 4A and 4C, the second semiconductor chip 300 may be shifted in the third direction D3 from the first semiconductor chip 200. The second semiconductor chip 300 may expose the top surface 200a of the first region R1 and the third region R3 of the first semiconductor chip 200. The second semiconductor chip 300 may cover the second region R2 of the first semiconductor chip 200.

The first semiconductor chip 200 may include the first to fourth signal pads 211, 212, 213, and 214 and the power/ground pads 219. The first to fourth signal pads 211, 212, 213, and 214 may be provided on the first and third regions R1 and R3 of the first semiconductor chip 200. The first to fourth signal pads 211, 212, 213, and 214 on the first region R1 of the first semiconductor chip 200 may have the same arrangement and electrical connection as those of the first to fourth signal pads 211, 212, 213, and 214, respectively, discussed above with reference to FIGS. 1A to 1E. The following describes the arrangement and electrical connection of the signal pads 211, 212, 213, and 214 on the third region R3 of the first semiconductor chip 200.

As illustrated in FIGS. 4C and 4D, the first to fourth signal pads 211, 212, 213, and 214 may be exposed on the top surface 200a of the third region R3 of the first semiconductor chip 200. When viewed in plan view, the first signal pad 211 on the third region R3 of the first semiconductor chip 200 may be closer than the second to fourth signal pads 212, 213, and 214 to the third side surface 200d of the first semiconductor chip 200. The fourth signal chip pad 214 may be closer than the second and third signal pads 212 and 213 to the third side surface 200d of the first semiconductor chip 200. The third signal pad 213 may be closer than the second signal pad 212 to the third side surface 200d of the first semiconductor chip 200. An interval B1 between the first and fourth signal pads 211 and 214 may be less than an interval B2 between the second and third signal pads 212 and 213 and an interval B3 between the third and fourth signal pads 213 and 214. The interval B3 between the third and fourth signal pads 213 and 214 may be greater than the interval B1 between the first and fourth signal pads 211 and 214 and the interval B2 between the second and third signal pads 212 and 213. As illustrated in FIG. 4D, the first to fourth signal pads 211, 212, 213, and 214 may be coupled through the internal wiring lines 260 to the integrated circuit section 250. The second to fourth signal pads 212, 213, and 214 may be electrically connected through the integrated circuit section 250 to the first signal pad 211.

The first to fourth signal connectors 510, 520, 530, and 540 may be provided on the first and third regions R1 and R3 of the first semiconductor chip 200. The first to fourth signal connectors 510, 520, 530, and 540 may have their electrical connections identical to those of the first to fourth signal connectors 510, 520, 530, and 540, respectively, discussed above with reference to FIGS. 1A to 1E. For example, the first to fourth signal connectors 510, 520, 530, and 540 may be coupled respectively to the first to fourth signal pads 211, 212, 213, and 214.

The first semiconductor chip 200 may be electrically connected to the substrate 100 through not only the first signal pad 211 on the first region R1 but also the first signal pad 211 on the third region R3. In such a configuration, the integrated circuit section 250 and the internal wiring lines 260 may be freely arranged and designed within the first semiconductor chip 200.

The first second semiconductor chip 310 may be electrically connected to the first semiconductor chip 200 through not only the second signal pad 212 on the first region R1 but also the second signal pad 212 on the third region R3. The second second semiconductor chip 320 may be electrically connected to the first semiconductor chip 200 through the third signal pad 213 on the first region R1 and the third signal pad 213 on the third region R3. The third second semiconductor chip 330 may be electrically connected to the first semiconductor chip 200 through the fourth signal pad 214 on the first region R1 and the fourth signal pad 214 on the third region R3. Therefore, an integrated circuit section may be more freely arranged and designed within each of the second and third second semiconductor chips 320 and 330.

The power/ground pad 219 may be disposed adjacent to one of the third and fourth side surfaces 200d and 200e of the first semiconductor chip 200. The first semiconductor chip 200 may be coupled through the first power/ground connector 610 to the power/ground connection pad 119 of the substrate 100. The first to third power/ground chip pads 319, 329, and 339 and the second to fourth power/ground connectors 620, 630, and 640 may have electrical connections that are substantially the same as those discussed above with reference to FIGS. 1A to 1C.

The first to fourth signal connectors 510, 520, 530, and 540 and the first to fourth power/ground connectors 610, 620, 630, and 640 may be bonding wires. In another implementation, one or more of the first to fourth signal connectors 510, 520, 530, and 540 and the first to fourth power/ground connectors 610, 620, 630, and 640 may be formed as wiring line patterns as discussed above with reference to FIG. 3.

By way of summation and review, with the development of electronic industry, it is increasingly desirable for a semiconductor chip to have integrated circuits with high performance and compactness.

As described above, embodiments relate to a semiconductor package including stacked semiconductor chips.

Embodiments may provide a compact semiconductor package.

Embodiments may provide a semiconductor package having high performance.

According to an embodiment, second semiconductor chips may be stacked on a first semiconductor chip. A semiconductor package may accordingly become compact-sized. The first semiconductor chip may have the same size and storage capacity as those of the second semiconductor chips. The second semiconductor chips may thus be easily electrically connected through connectors to an integrated circuit section of the first semiconductor chip. The first semiconductor chip and the second semiconductor chips may be fabricated at high yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a substrate;
   a lower semiconductor chip on the substrate, the lower semiconductor chip having a first region and a second region in a plan view;
   a first upper semiconductor chip on a top surface of the second region of the lower semiconductor chip and exposing a top surface of the first region of the lower semiconductor chip;
   a second upper semiconductor chip on the first upper semiconductor chip;
   a first signal bonding wire on the top surface of the first region of the lower semiconductor chip and coupled to the first upper semiconductor chip and the lower semiconductor chip;
   a first ground bonding wire on a top surface of the first upper semiconductor chip and coupled to the substrate, the first ground bonding wire being spaced apart from the lower semiconductor chip; and
   a second ground bonding wire on a top surface of the second upper semiconductor chip and coupled to the substrate, the second ground bonding wire being spaced apart from the lower semiconductor chip and the first upper semiconductor chip,
   wherein the first ground bonding wire and the second ground bonding wire are electrically isolated from the lower semiconductor chip.

2. The semiconductor package of claim 1, further comprising a second signal bonding wire on the top surface of the first region of the lower semiconductor chip, and electrically connected to the second upper semiconductor chip and the lower semiconductor chip.

3. The semiconductor package of claim 2, wherein an integrated circuit section of the lower semiconductor chip is electrically connected to the first signal bonding wire and the second signal bonding wire.

4. The semiconductor package of claim 1, further comprising a ground bonding wire on the top surface the second region of the lower semiconductor chip, and electrically connected to the substrate and the lower semiconductor chip,
   wherein the ground bonding wire vertically overlaps with the first upper semiconductor chip.

5. The semiconductor package of claim 4, further comprising a signal bonding wire on the top surface the first region of the lower semiconductor chip, the signal bonding wire being electrically connected to the substrate and the lower semiconductor chip.

6. The semiconductor package of claim 1, further comprising:
   a third upper semiconductor chip on the second upper semiconductor chip; and
   a third signal bonding wire on the top surface of the first region the lower semiconductor chip, and electrically connected to the third upper semiconductor chip and the lower semiconductor chip.

7. The semiconductor package of claim 6, further comprising a third ground bonding wire on a top surface of the third upper semiconductor chip, and coupled to the substrate and the third upper semiconductor chip,
   wherein the third ground bonding wire is spaced apart from the lower semiconductor chip, the first upper semiconductor chip, and the second upper semiconductor chip.

8. A semiconductor package, comprising:
   a substrate;
   a solder terminal on a bottom surface of the substrate;
   a first semiconductor chip on a top surface of the substrate, the first semiconductor chip having a first region and a second region in a plan view;
   a second semiconductor chip on a top surface of the second region of the first semiconductor chip, the second semiconductor chip exposing a top surface of the first region of the first semiconductor chip;
   a third semiconductor chip on the second semiconductor chip;
   a fourth semiconductor chip on the third semiconductor chip; and
   a molding layer on the substrate and covering the first and fourth semiconductor chips, wherein:
   the first semiconductor chip includes:
      a first pad on the top surface of the first region of the first semiconductor chip and electrically connected to the substrate;

a second pad on the top surface of the first region of the first semiconductor chip and electrically connected to the second semiconductor chip;
a third pad on the top surface of the first region of the first semiconductor chip and electrically connected to the third semiconductor chip; and
a fourth pad on the top surface of the first region of the first semiconductor chip and electrically connected to the fourth semiconductor chip,
the first region of the first semiconductor chip is adjacent to a first sidewall of the first semiconductor chip,
the first pad is between the second pad and the first sidewall of the first semiconductor chip in a plan view,
the third pad is between the first pad and the second pad, and
the fourth chip pad is between the first pad and the third pad.

9. The semiconductor package of claim 8, wherein an interval between the first pad and the third pad is greater than a second interval between the second pad and the third pad.

10. The semiconductor package of claim 9, wherein:
the first pad and the fourth pad are spaced apart at a first interval,
the third pad and the fourth pad are spaced apart at a third interval, and
the third interval is greater than the first interval.

11. The semiconductor package of claim 10, wherein the second interval is greater than the first interval.

12. The semiconductor package of claim 11, wherein the third interval is greater than the second interval.

13. The semiconductor package of claim 10, wherein:
the first pad is electrically connected to the solder terminal through the substrate,
the first semiconductor chip includes an integrated circuit section in the first region of thereof,
the second pad is electrically connected to the substrate through the integrated circuit section and the first pad,
the third pad is electrically connected to the substrate through the integrated circuit section and the first pad, and
the fourth pad is electrically connected to the substrate through the integrated circuit section and the first pad.

14. The semiconductor package of claim 8, further comprising:
a first ground bonding wire on a top surface of the second semiconductor chip and coupled to the substrate; and
a second ground bonding wire on a top surface of the third semiconductor chip and coupled to the substrate,
wherein the first ground bonding wire and the second ground bonding wire are not vertically overlapped with the first region of the first semiconductor chip in a plan view.

15. The semiconductor package of claim 14, wherein the first ground bonding wire and the second ground bonding wire are spaced apart from the first semiconductor chip.

16. A semiconductor package, comprising:
a substrate;
a first semiconductor chip on the substrate, and having a first region and a second region in a plan view;
a second semiconductor chip on a top surface of the second region of the first semiconductor chip and exposing a top surface of the first region of the first semiconductor chip;
a first signal bonding wire on the top surface of the first region of the first semiconductor chip, and coupled to the first semiconductor chip and the substrate;
a second signal bonding wire on the top surface of the first region of the first semiconductor chip, and coupled to the first semiconductor chip and the second semiconductor chip;
a first ground bonding wire on the top surface the second region of the first semiconductor chip, and coupled to the substrate and the first semiconductor chip; and
a second ground bonding wire on a top surface of the second semiconductor chip and coupled to the substrate,
wherein the second ground bonding wire is spaced apart from the first semiconductor chip and electrically isolated from the first semiconductor chip.

17. The semiconductor package of claim 16, wherein the first ground bonding wire vertically overlaps with the second semiconductor chip.

18. The semiconductor package of claim 16, further comprising:
a third semiconductor chip on the second semiconductor chip;
a third signal bonding wire on the top surface of the first region of the first semiconductor chip, and coupled to the first semiconductor chip and the third semiconductor chip; and
a third ground bonding wire on a top surface of the third semiconductor chip and electrically connected to the substrate,
wherein the third ground bonding wire is spaced apart from the first and second semiconductor chips.

19. The semiconductor package of claim 18, further comprising:
a fourth semiconductor chip on the third semiconductor chip;
a fourth signal bonding wire on the top surface of the first region of the first semiconductor chip, and electrically connected to the first semiconductor chip and the fourth semiconductor chip; and
a fourth ground bonding wire on a top surface of the fourth semiconductor chip and electrically connected to the substrate,
wherein the fourth ground bonding wire is spaced apart from the first, second, and third semiconductor chips.

20. The semiconductor package of claim 19, wherein:
the first semiconductor chip includes:
a first pad on the top surface of the first region of the first semiconductor chip and connected to the first signal bonding wire;
a second pad on the top surface of the first region of the first semiconductor chip and connected to the second signal bonding wire;
a third pad on the top surface of the first region of the first semiconductor chip and connected to the third signal bonding wire; and
a fourth pad on the top surface of the first region of the first semiconductor chip and connected to the fourth signal bonding wire,
the second pad is between the first pad and the second region of the first semiconductor chip in a plan view,
the fourth pad is between the first pad and the second pad, and
the third pad is between the fourth pad and the second pad.

* * * * *